(12) United States Patent
Kadakia et al.

(10) Patent No.: US 8,445,331 B2
(45) Date of Patent: May 21, 2013

(54) MULTICHIP ELECTRONIC PACKAGES AND METHODS OF MANUFACTURE

(75) Inventors: Suresh D. Kadakia, Hopewell Junction, NY (US); Kamal K. Sikka, Poughkeepsie, NY (US); Hilton T. Toy, Hopewell Junction, NY (US); Jeffrey A. Zitz, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/433,468

(22) Filed: Mar. 29, 2012

(65) Prior Publication Data
US 2012/0196408 A1    Aug. 2, 2012

Related U.S. Application Data

(62) Division of application No. 12/897,933, filed on Oct. 5, 2010.

(51) Int. Cl.
    *H01L 21/44* (2006.01)
(52) U.S. Cl.
    USPC .................................. 438/126; 257/E21.502
(58) Field of Classification Search
    USPC ........................................................ 438/126
    See application file for complete search history.

(56) References Cited

U.S. PATENT DOCUMENTS

| 3,777,220 | A | 12/1973 | Tatusko et al. |
| 4,246,597 | A | 1/1981 | Cole et al. |
| 4,535,384 | A | 8/1985 | Wakabayashi et al. |
| 4,639,829 | A | 1/1987 | Ostergren et al. |
| 5,177,667 | A | 1/1993 | Graham et al. |
| 6,294,408 | B1 * | 9/2001 | Edwards et al. ............. 438/121 |
| 6,404,638 | B1 | 6/2002 | Messina |
| 6,541,310 | B1 | 4/2003 | Lo et al. |
| 6,949,413 | B2 | 9/2005 | Lo et al. |
| 6,999,317 | B2 | 2/2006 | Chengalva et al. |
| 7,193,318 | B2 | 3/2007 | Colgan et al. |
| 7,724,527 | B2 | 5/2010 | Coico et al. |
| 2002/0160412 | A1 | 10/2002 | Bawendi et al. |
| 2006/0087816 | A1 | 4/2006 | Ewes et al. |

OTHER PUBLICATIONS

Eid et al., "Circuit Module With Evaporative Cooling From Sintered Coating on Pistons", IP.com PriorArtDatabase, May 1, 1987 (3 pages).
Bajorek et al., "Improved Pistons For Cooling Circuit Chip Mounted on Packages", IP.com PriorArtDatabase, Feb. 1, 1980 (3 pages).
Sikka et al., "Multi-Chip Package Thermal Management of IBM z-Server Systems", ITHERM 2006, pp. 537-544.

(Continued)

*Primary Examiner* — Chandra Chaudhari
(74) *Attorney, Agent, or Firm* — Matthew Zehrer; Roberts Mlotkowski Safran & Cole, P.C.

(57) ABSTRACT

A multi-chip electronic package and methods of manufacture are provided. The multi-chip package includes a plurality of chips mounted on a chip carrier. The multi-chip package further includes a lid mounted on the chip carrier using a bonding material or compression seal, and at least one single piston extending from the lid. Each piston covers an entirety of multiple chips of the plurality of chips.

17 Claims, 4 Drawing Sheets

OTHER PUBLICATIONS

Coico et al., "Internal Thermal Management of IBM P-Server Large Format Multi-Chip Modules Utilizing Small Gap Technology", ASME/PACIFIC Rim Technical Conference and Exhibition on Intergration and Packaging of MEMS, NEMS and Electronic Systems, 2005, pp. 1-6.

Office Action for related U.S. Appl. No. 12/897,933 dated Nov. 28, 2012.
Final Office Action for related U.S. Appl. No. 12/897,933 dated Mar. 26, 2013.
Definition of "conventional" from www.thefreedicionary.com.

* cited by examiner

MULTICHIP ELECTRONIC PACKAGES AND METHODS OF MANUFACTURE

CROSS REFERENCE TO RELATED APPLICATIONS

The present application is a divisional application of co-pending U.S. application Ser. No. 12/897,933, filed on Oct. 5, 2010, the contents of which are incorporated by reference in its entirety herein.

FIELD OF THE INVENTION

The invention relates to semiconductor package structures and methods of manufacture and, more particularly, to multi-chip electronic packages and methods of manufacture.

BACKGROUND

Thermal management of multi-chip electronic packages is critical to ideal performance of the multi-chip electronic packages and related electronic systems. Currently, multi-chip electronic packages encapsulate chips between a lid and chip carrier by forming a gap between pistons of the lid and the chips mounted on the chip carrier, and dispensing a thermal interface material (TIM) within the gap. The gap is formed by the use of a chip shim placed between each piston of the lid and a respective singe chip of the multi-chip electronic packages.

However, semiconductor chips are increasing in size due to requirements of incorporating increased functionality (e.g., logic and memory). This increase in semiconductor chip size together with the requirement to package multiple chips and decoupling capacitors on the same chip carrier lead to increasing chip carrier sizes and increasing costs. One solution to packaging multiple larger chips on the same chip carrier is to decrease the inter-chip spacing by restricting bond and assembly ground rules and cooling hardware changes. For example, FIG. 1a shows a space provided between the chips on the carrier, on the order of 1 millimeter to 2 millimeter spacing with, for example, passive components (e.g., capacitors), between the chips. Chip to chip spacings of <1 mm are possible if passive components are not required. These bond and assembly ground rule changes, though, can have undesirable consequences on the final product such as, for example, an increase in temperature of the chip.

More specifically, FIG. 1b shows a conventional chip package including a plurality of chips 12 attached to a chip carrier 10. A lid or hat 14 (hereinafter referred to as a lid) is positioned over the chip carrier 10, with thermal paste between each of the plurality of chips and a respective piston 16. As is known in the industry, the pistons 16 and thermal paste act as heat sinks, cooling the chips 12 during operation of the chips 12, e.g., in the final product such as, for example, a computer. In these conventional systems, only a single piston is provided for a single chip. However, as shown in FIG. 1b, the pistons 16 do not cover the entirety of the chip 12, leaving uncovered spaces at edges of the chip. This is mainly due to the fact that the pistons cannot have the same spacing as the chips which, in turn, leads to an increase in chip temperature.

More specifically, as should be understood, the plurality of chips and the pistons are not under the same spacing constraints. For example, in chip package design, it is possible to place the chips 12 on the carrier with a very narrow space therebetween, e.g., typically about 1 millimeter to 2 millimeters. However, this same spacing is not possible between the pistons while still maintaining the lid integrity. For example, utilizing a typical lid material of copper or aluminum, the spacing between the pistons on the lids has to be much larger, e.g., on the order of 4 to 5 millimeters, to ensure that the lid does not warp. For this reason, it is not possible for the each piston 16 to completely cover the surfaces of a respective chip 12, as a surface area of the piston must be smaller than a surface are of the chip due to the constrain on piston spacing. This results in an increase in temperature at the chips' edges.

FIG. 1c shows a graph of temperature vs. chip spacing using the conventional package of FIG. 1b. More specifically, FIG. 1c shows a significant increase of about 4° C. at the edges of the chips, which are uncovered. The temperature increase also affects the central area or core of the chips, e.g., with about a 2° C. increase in temperature. As should be understood by those of skill in the art, this temperature increase can affect performance of the chip package.

Accordingly, there exists a need in the art to overcome the deficiencies and limitations described hereinabove.

SUMMARY

In a first aspect of the invention, a multi-chip package comprises a plurality of chips mounted on a chip carrier. The multi-chip package further comprises a lid mounted on the chip carrier using a bonding material or compression seal. The multi-chip package further comprises at least one single piston extending from the lid, where each piston covers an entire surface of the multiple chips of the plurality of chips.

In another aspect of the invention, a structure comprises a lid encapsulating at least two chips mounted on a chip carrier. The structure further comprises a single piston of a lid assembly completely covering the at least two chips. The structure further comprises thermal interface material within a gap formed between the single piston and the at least two chips. The thermal interface material contacts the single piston of the lid assembly and the at least two chips.

In yet another aspect of the invention, a method comprises aligning a piston of a lid assembly over multiple chips mounted on a chip carrier. The method further comprises separating the lid and the chip carrier. The method further comprises dispensing thermal interface material within a gap formed by a chip shim, and in contact with the multiple chips. The method further comprises sealing the lid to the chip carrier such that the piston is entirely covering surfaces of the multiple chips mounted on the chip carrier.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to multi-chip electronic packages and methods of manufacture. More specifically, the present invention is directed to small gap cooling technology with a piston spanning multiple chips on a common chip carrier. Advantageously, the piston design allows for closer chip spacing, simplified bond and assembly fixtures and reduced bond and assembly cost for chip manufacturing. Also, the piston design ensures that the chips are completely covered, thereby reducing any risk for increased temperature during use; compared to conventional piston designs that only partially cover single chips based on minimum chip spacing.

Figure 2:
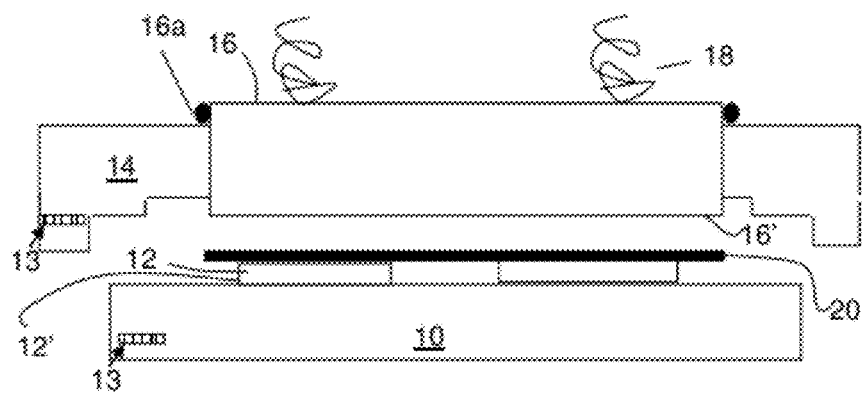
FIG. 2 shows an unassembled multi-chip electronic package in accordance with aspects of the present invention.

FIG. 2 shows a package in a disassembled state, in accordance with aspects of the present invention. More specifically, FIG. 2 shows a plurality of chips 12 attached to a chip carrier 10. The chip carrier 10 can be a ceramic, organic, silicon or other chip carrier. In embodiments, the spacing between the chips 12 is about 1 millimeter to 2 millimeters; although, other spacing is also contemplated by the present invention (e.g., for low power chips). A lid 14 is positioned over the chip carrier 10 such that a single piston 16 is aligned (registered) with multiple chips 12, respectively. In embodiments, the single piston 16 completely covers multiple chips 12, respectively. In further embodiments, the piston 16 has an edge 16' that overlaps an edge 12' of the chips 12, thus ensuring complete coverage of the chips 12.

Although not shown in FIG. 2, it should be understood by those of skill in the art that multiple pistons 16 can also be provided, each of which would cover multiple chips 12. (See, FIGS. 6a-6d.) The lid 14 can also have pistons that cover single chips, but in practice, these chips would not be spaced close together and would, likely, be low power chips that do not generate as much heat as the chips 12 (which may be high power chips).

Still referring to FIG. 2, the piston 16 can be releasably attached to the lid 14 by many different methods as shown by reference numeral 16a. For example, the pistons 16 can be soldered to the lid 14 by solder, or attached by an epoxy of other adhesive. In embodiments, the piston 16 can be made from copper, for example, and should have a larger footprint than multiple chips 12. Also, the piston 16 can be spring loaded into the lid 14 using springs or other resilient mechanisms 18. In further embodiments, the piston 16 can be placed into a hole of the lid, without the use of any resilient mechanisms. A chip shim 20 is placed between the piston 16 and the multiple chips 12 in order to form a gap between the piston 16 and the chips 12. The gap, during assembly, is then filled with a Thermally-conducting Interface Material or "TIM".

Figure 3:
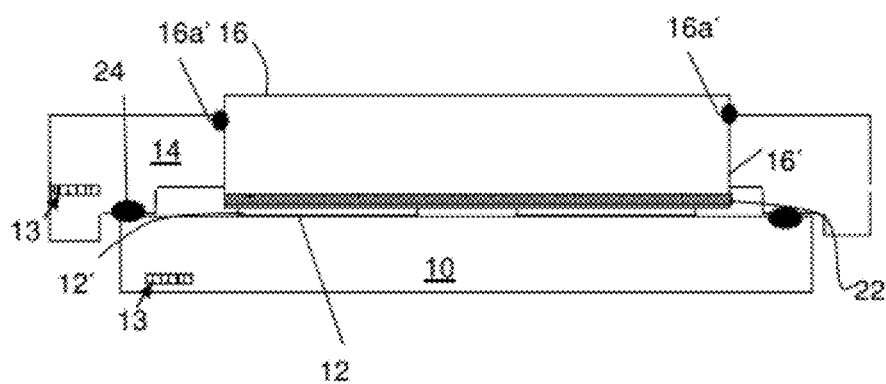
FIG. 3 shows an assembled multi-chip electronic package in accordance with aspects of the present invention.
Figure 4:
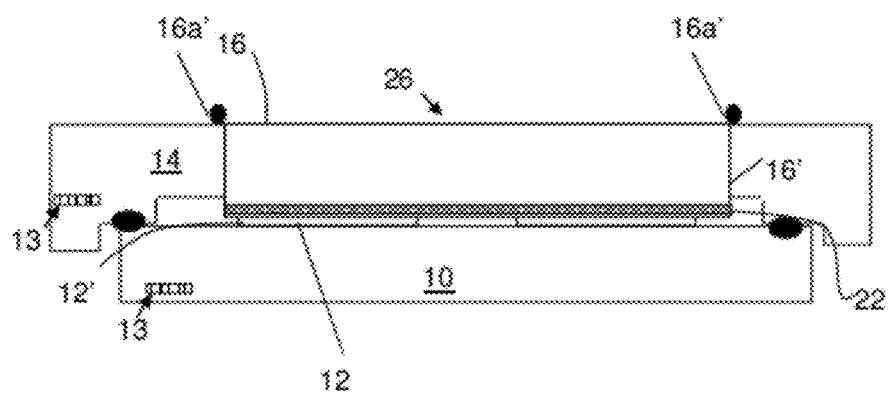
FIG. 4 shows a completely assembled multi-chip electronic package in accordance with aspects of the present invention.

In the embodiments described thus far, the lid 14 and chip carrier 10 can be customized for each other. For this reason, the lid 14 and chip carrier 10 combination can be marked by, for example, a bar code or other indicia shown at reference numeral 13 to ensure that the matched lid 14 and chip carrier 10 are attached to one another, in later processing steps, to form a multi-chip electronic package as shown in FIG. 3 or 4. The bar code or other indicia 13 can provide information about the lid 14 and chip carrier 10, as well as the thermal interface gap that is created between the piston 16 and chips 12.

FIG. 3 shows an assembled chip package in accordance with aspects of the invention. In embodiments, the lid 14 and/or the chip carrier 10 can be moved in close proximity to one another. The piston 16 is aligned (registered) with the chips 12, and completely covers the chips 12. That is, the single piston 16 completely covers multiple chips 12, respectively, i.e., the edge 16' of the piston can overlap an edge 12' of the chips 12 thus ensuring complete coverage of the chip 12. A TIM 22 is placed between the piston 16 and the chips 22. In this lowered position, the piston 16 can be fixed to the lid 14 by, for example, adhesive or epoxy or other bonding agent (including a solder), as shown by reference numeral 16a'.

In further embodiments, the lid 14 can be bonded to the chip carrier 10 by an adhesive or sealant 24, for example. This will encapsulate the chips on the chip carrier, for example. By way of examples, many materials can be used for the bonding such as, for example, silicone, adhesive or epoxy, for example, know to those of skill in the art. A mechanical compression seal may also be utilized for additional hermeticity, if desired. In this way, the lid 14 will be permanently attached to the chip carrier 10, forming a multi-chip electronic package.

As shown in FIG. 4, the position of the piston 16 in a final position, with respect to the lid 14 and the chips 12. The back side of the piston 16 can be planarized to a flat surface 26 with the surface of the lid 14. In embodiments, the planarization can be performed by a mechanical planarization process such as, for example, a grinding or cutting process, well known to those of skill in the art. The planarization allows good thermal contact between the lid and an external cooling device such as a heat sink or cold plate. In this lowered position, the piston 16 remains fixed to the lid 14 by, for example, adhesive or epoxy or other bonding agent (including a solder), as shown by reference numeral 16a'.

Figure 5:
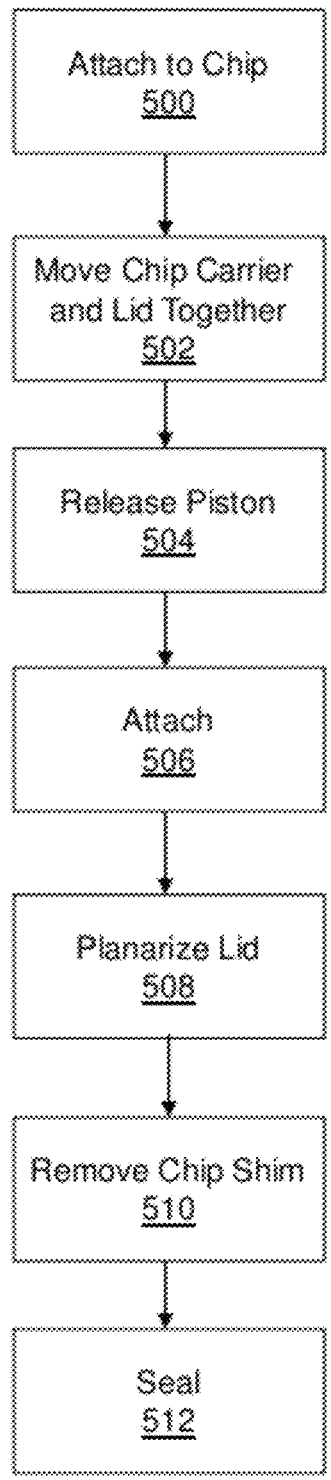
FIG. 5 represents a flow of stages for assembling the multi-chip electronic packages in accordance with aspects of the present invention.

FIG. 5 represents a flow of stages for assembling the multi-chip electronic packages in accordance with aspects of the present invention. At step 500, a plurality of chips 12 are attached to a chip carrier 10 and a lid is positioned over the chip carrier 10 such that a piston 16 is aligned (registered) with a plurality of chips 12. At step 502, the lid 14 and/or the chip carrier 10 can be moved in close proximity to one another, with the piston 16 aligned (registered) with at least two chips 12, respectively, to ensure complete coverage of the at least two chips. Once the lid 14 and/or the chip carrier 10 are in close proximity to one another and the piston 16 and chips 12 aligned, at step 504, the piston 16 is released in order to come into direct contact with the chip shim in order to provide a gap for placement of TIM. For example, in the case of an adhesive or epoxy or other bonding agent, a chemical solution can be used to release the piston 16 from the lid 14. Once the piston 16 is released, it will move into direct contact with the chip shims. In the case of solder, the solder will flow during a heating process, thus releasing the piston. At this stage of processing, for example, the piston 16 can be forced into direct contact with the chips 12 by the force of the springs or other resilient mechanisms 18 of a fixture or mechanism attached to lid 14.

In alternate embodiments, the piston 16 can be placed into a hole of the lid after the lid 14 and/or the chip carrier 10 are moved in close proximity to one another. In this embodiment, the hole is aligned with the chips 12. Once in alignment, the piston 16 is placed into the holes, and allowed to come into direct physical contact with the chip shim 12, and be in alignment with the chips for complete coverage.

At step 506, the piston 16 is fixedly attached to the lid 14, and the lid is then removed from the chip carrier 10. In embodiments, as the assembly cools, solder used to hold the piston can harden and again fix the piston 16 to the lid 14, but now in a lowered position. Alternatively, in this lowered position, the piston 16 can be fixed to the lid 14 by, for example, adhesive or epoxy or other bonding agent (including a solder). The position of the piston 16 is in a final position, with respect to the lid 14. At step 508, the piston can be planarized.

The chip shim is removed and the thermal interface material is then placed on the chips, at step 510. Once the thermal interface material is on the chips 12, the chip carrier 10 and lid are sealed to one another in order to encapsulate the chips 12, at step 512.

Figure 1A:
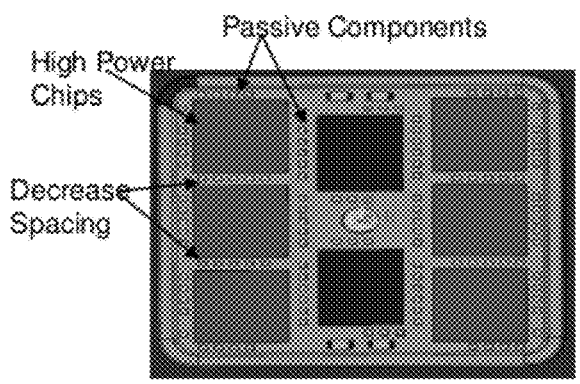
FIG. 1a shows a conventional chip carrier with multiple chips mounted thereon.
Figure 1B:
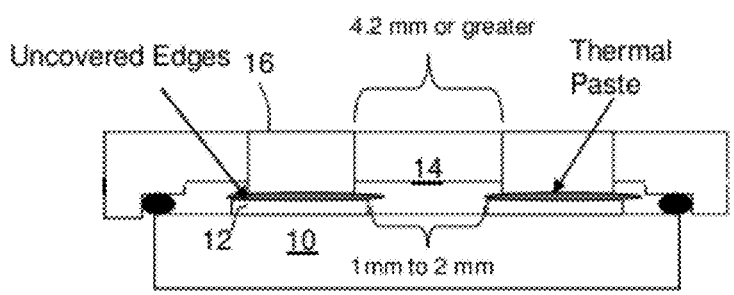
FIG. 1b shows a conventional multi-chip electronic package with chips that have uncovered edges.
Figure 1C:
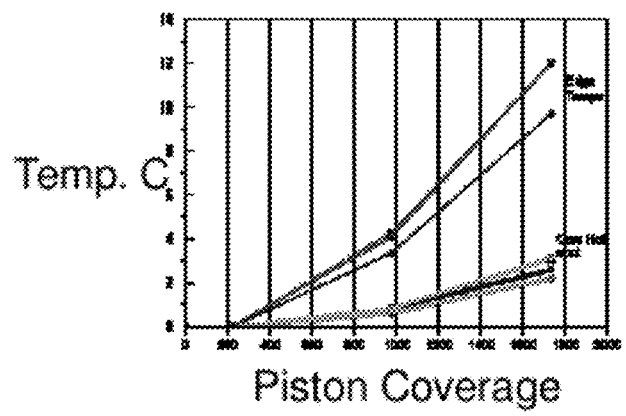
FIG. 1c shows a graph of temperature vs. chip spacing using a conventional package of FIG. 1b.

Advantageously, the method and structure of the present invention is customizable for chips of different sizes (e.g., different thickness), shapes, and power levels. For example, taking FIG. 1a as an example of a chip package, the piston 16 can cover three high power chips, in a single row. As a further illustration, two pistons 16 can be used to cover three high power chips, in each row. Alternatively, the piston 16 can cover all of the high power chips, with another piston covering the low power chips positioned in the middle of the package.

Figure 6A:
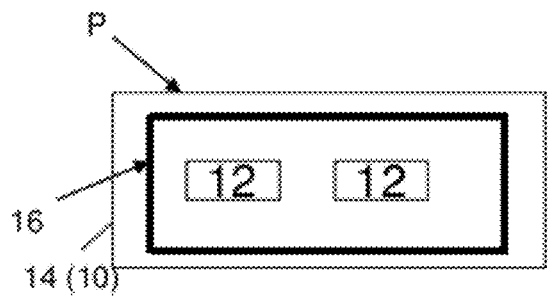
FIGS. 6a-6d show several exemplary arrangements and configurations of the piston with regard to multiple chips on the chip carrier in accordance with aspects of the present invention.
Figure 6B:
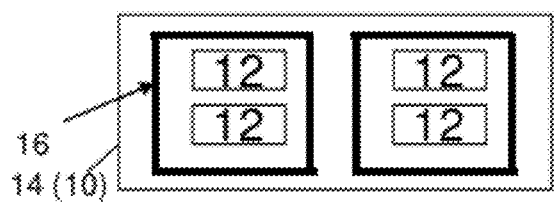
Figure 6C:
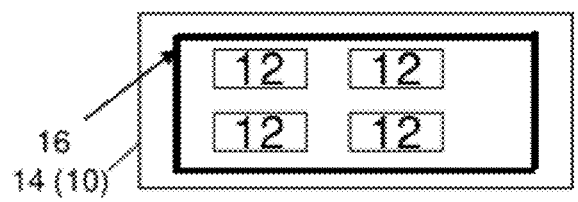
Figure 6D:
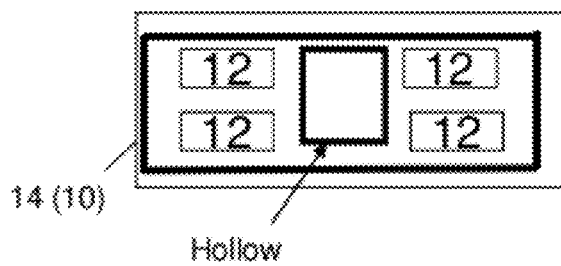

FIGS. 6a-6d show several exemplary arrangements and configurations of the piston with regard to multiple chips on the chip carrier. For example, as shown in FIG. 6a, the piston 16 can be provided about the entire perimeter (circumference) "P" of the lid 14 or chip carrier 10, while covering two or more chips 12. As shown in FIG. 6b, two pistons 16 can be provided to cover two chips in different rows mounted on the chip carrier 10. As shown in FIG. 6c, a single piston 16 can cover multiple chips 12 in multiple rows mounted on the chip carrier 10. As shown in FIG. 6d, a single piston 16 can cover multiple chips 12 in multiple rows positioned on the chip carrier 10, with a hollow center. As should be recognized by those of skill, the arrangements and configurations of FIGS. 6a-6d are merely exemplary, and that other arrangements and configurations are also contemplated by the present invention, as represented by FIGS. 6a-6d.

Figure 7:
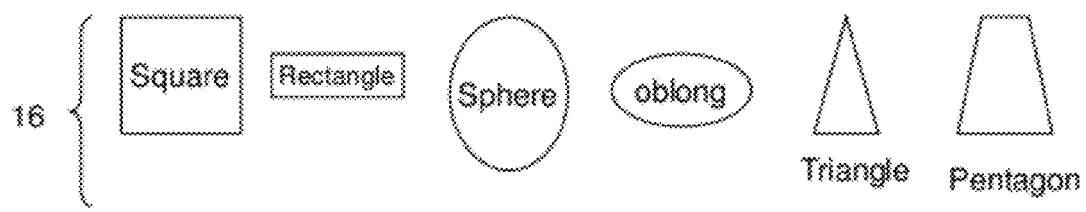
FIG. 7 shows cross sectional views of piston configurations used in the multi-chip electronic packages in accordance with aspects of the present invention.

FIG. 7 shows cross sectional views of various piston dimensions used in the multi-chip electronic packages in accordance with aspects of the present invention. Note that sharp corners may be rounded or chamfered for ease of manufacture. For example, the piston 16 can be square, rectangular, spherical (oblong), cylindrical (oblong), triangular or pentagon shaped, to name a few. Sharp corners may be rounded or chamfered for ease of manufacture.

The method as described above is used in the packaging of integrated circuit chips. The integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method, comprising:
aligning a piston of a lid assembly over multiple chips mounted on a chip carrier;
separating the lid and the chip carrier;
dispensing thermal interface material within a gap formed by a chip shim, and in contact with the multiple chips; and
sealing the lid to the chip carrier such that the piston is entirely covering surfaces of the multiple chips mounted on the chip carrier.

2. The method of claim 1, further comprising planarizing the piston with a surface of the lid and fixing the piston to the lid.

3. The method of claim 2, further comprising fixing the piston to the lid by cooling solder such that the solder bonds the piston to the lid.

4. A method, comprising:
aligning a single piston of a lid assembly over at least two chips mounted on a chip carrier;
placing a chip shim over the at least two chip mounted on the chip carrier;
releasing the single piston from the lid assembly in order to contact the at least one chip shim which provides a gap between the single piston and the at least two chips during subsequent encapsulation of the at least two chips mounted on the chip carrier;
separating the lid assembly and the chip carrier;
encapsulating the at least two chips mounted on the chip carrier with the lid assembly by completely covering the at least two chips with the single piston of the lid assembly and providing thermal interface material within the gap formed between the single piston and the at least two chips, the thermal interface material contacting the single piston of the lid assembly and the at least two chips.

5. The method of claim 4, wherein the single piston covers at least three chips mounted on the chip carrier.

6. The method of claim 4, wherein the chip carrier is one of organic, ceramic or silicon.

7. The method of claim 4, wherein the single piston is planar with a surface of the lid.

8. The method of claim 4, wherein the at least two chips have a spacing therebetween of about 1 millimeter to about 2 millimeters.

9. The method of claim 4, wherein the single piston is fixed to the lid by a solder.

10. The method of claim 4, wherein edges of the single piston overlap edges of the at least two chips.

11. The method of claim 1, further comprising placing the chip shim on the multiple chips mounted on the chip carrier and releasing the piston from the lid assembly when the piston is aligned over multiple chips.

12. The method of claim 11, wherein the piston is a single piston that covers the multiple chips mounted on the chip carrier.

13. The method of claim 12, further comprising planarizing the single piston with a surface of the lid assembly.

14. The method of claim 12, wherein the single piston has a single, contiguous surface facing and completely covering the multiple chips.

15. The method of claim 14, wherein the thermal interface material within the gap contacts the single, contiguous surface of the single piston of the lid assembly.

16. The method of claim 11, further comprising affixing the lid assembly to the piston by one of adhesive, epoxy and solder.

17. The method of claim 11, further comprising fixing the chip carrier to the lid assembly by an adhesive or sealant.

* * * * *